United States Patent
Liao et al.

(10) Patent No.: US 10,747,077 B2
(45) Date of Patent: Aug. 18, 2020

(54) DISPLAY SUBSTRATE AND DISPLAY DEVICE

(71) Applicant: BOE TECHNOLOGY GROUP CO., LTD., Beijing (CN)

(72) Inventors: Feng Liao, Beijing (CN); Xue Dong, Beijing (CN); Jing Lv, Beijing (CN); Yunsik Im, Beijing (CN); Yoonsung Um, Beijing (CN); Xinxing Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/108,956

(22) Filed: Aug. 22, 2018

(65) Prior Publication Data
US 2019/0204700 A1 Jul. 4, 2019

(30) Foreign Application Priority Data
Jan. 2, 2018 (CN) .......................... 2018 1 0002791

(51) Int. Cl.
*G09G 3/36* (2006.01)
*G02F 1/1362* (2006.01)
(Continued)

(52) U.S. Cl.
CPC .. *G02F 1/136286* (2013.01); *G02F 1/133512* (2013.01); *G09G 3/3611* (2013.01);
(Continued)

(58) Field of Classification Search
CPC .............................. G09G 3/3685; G06F 3/041
(Continued)

(56) References Cited

U.S. PATENT DOCUMENTS 6,885,110 B1* 4/2005 Ogawa .............. G02F 1/136286
174/255
7,548,288 B2 6/2009 Kim et al.
(Continued)

FOREIGN PATENT DOCUMENTS

CN 1808250 A 7/2006
CN 103472613 A 12/2013
(Continued)

OTHER PUBLICATIONS

First Office Action dated Jan. 8, 2020, for corresponding Chinese application 201810002791.X.

*Primary Examiner* — Roy P Rabindranath
(74) *Attorney, Agent, or Firm* — Nath, Goldberg & Meyer; Joshua B. Goldberg

(57) ABSTRACT

The present disclosure provides a display substrate and a display device. The display substrate includes a base substrate, a plurality of data lines and a plurality of pixels arranged in an array on the base substrate, each of the data lines extends along a column direction, the pixels in a single column are connected to one single data line of the data lines, any two data lines of the data lines connected to adjacent columns of the pixels constitute a pair of data lines, any two adjacent pixels in each row of the pixels constitute a pair of pixels, each pair of data lines pass through one row of any two adjacent rows of the pixels by extending between two pairs of pixels, and pass through another one row of the two adjacent rows of the pixels by extending between two pixels of one pair of pixels.

9 Claims, 3 Drawing Sheets

(51) Int. Cl.
*G02F 1/1335* (2006.01)
*H01L 27/12* (2006.01)
*G06F 3/047* (2006.01)

(52) U.S. Cl.
CPC ...... *H01L 27/124* (2013.01); *G02F 2201/121* (2013.01); *G02F 2201/123* (2013.01); *G06F 3/047* (2013.01)

(58) Field of Classification Search
USPC ............................................. 345/87–88, 100
See application file for complete search history.

(56) References Cited

U.S. PATENT DOCUMENTS

| | | | | |
|---|---|---|---|---|
| 2005/0200791 | A1* | 9/2005 | Ahn .................. | G02F 1/134363 349/141 |
| 2006/0164350 | A1* | 7/2006 | Kim ..................... | G09G 3/3614 345/87 |
| 2010/0144391 | A1* | 6/2010 | Chang ................. | G02F 1/13338 455/566 |
| 2012/0162278 | A1* | 6/2012 | Cheng ................. | G09G 3/3607 345/690 |
| 2015/0355764 | A1* | 12/2015 | Mizuhashi ............ | G06F 3/0412 345/173 |
| 2017/0160604 | A1* | 6/2017 | Wang ................ | G02F 1/134336 |

FOREIGN PATENT DOCUMENTS

| | | | |
|---|---|---|---|
| CN | 104714345 | A | 6/2015 |
| CN | 106783892 | A | 5/2017 |

* cited by examiner

DISPLAY SUBSTRATE AND DISPLAY DEVICE

CROSS-REFERENCE TO RELATED APPLICATIONS

The present application claims the priority of Chinese Patent Application No. 201810002791.X, filed on Jan. 2, 2018, the contents of which are incorporated herein in their entirety by reference.

TECHNICAL FIELD

The present disclosure relates to the field of display technology, and in particular to a display substrate and a display device.

BACKGROUND

With development of technology for manufacturing a display, liquid crystal display has gradually became a mainstream of flat panel display substituting for a traditional cathode ray tube display. In the field of liquid crystal display, thin film transistor liquid crystal display (TFT-LCD) is widely used in the field of television, computer, mobile phone or the like for its large size, high integration, powerful function, flexible production process, low cost and so on.

Advanced super dimension switch (ADS) liquid crystal display panel includes a slit electrode and a plate electrode, an electric field is generated between any adjacent edges of the slit electrode in a single plane, another electric filed is generated between the slit electrode and the plate electrode, thus a multi-dimensional electric field is formed such that all liquid crystal molecules in a liquid crystal cell are enabled to rotate, thereby improving an operation efficiency of the liquid crystal molecules and a light transmission efficiency of the liquid crystal display panel. The ADS liquid crystal display panel is manufactured by aligning and combining display substrates (e.g., an array substrate and a color filter substrate), and filling with liquid crystal between the display substrates.

SUMMARY

An embodiment of the present disclosure provides a display substrate, including a base substrate, a plurality of data lines and a plurality of pixels arranged in an array on the base substrate, each of the data lines extends along a column direction, the pixels in a single column are connected to one single data line of the data lines, any two data lines of the data lines connected to adjacent columns of the pixels constitute a pair of data lines, any two adjacent pixels in each row of the pixels constitute a pair of pixels, each pair of data lines pass through one row of any two adjacent rows of the pixels by extending between two pairs of pixels, and pass through another one row of the two adjacent rows of the pixels by extending between two pixels of one pair of pixels.

In some implementations, the display substrate further includes a common electrode line provided between any two adjacent columns of pixels.

In some implementations, in a case where the display substrate is used for a touch function, the common electrode line is multiplexed as a touch line.

In some implementations, each data line includes a plurality of segments and a connection part for connecting any two adjacent segments together, and each segment is provided in correspondence with one pixel in one column of pixels.

In some implementations, the display substrates further includes a gate line provided between any two adjacent rows of pixels, and the connection part is provided in parallel to the gate line.

In some implementations, each pixel includes a plate electrode and a slit electrode successively provided in a direction away from the base substrate.

In some implementations, one of the plate electrode and the slit electrode is a pixel electrode, and another one of the plate electrode and the slit electrode is a common electrode.

An embodiment of the present disclosure further provides a display device including a display panel, and the display panel includes the display substrate according to the embodiment of the present disclosure.

In some implementations, the display substrate is an array substrate, and the display panel further includes a color filter substrate provided opposite to the array substrate, and a black matrix is provided in a region of the color filter substrate corresponding to the data lines of the array substrate.

DESCRIPTION OF EMBODIMENTS

In order to make a person skilled in the art understand technical solutions of the present disclosure better, the present disclosure will be described in detail below in conjunction with accompanying drawings and specific embodiments.

Figure 1:
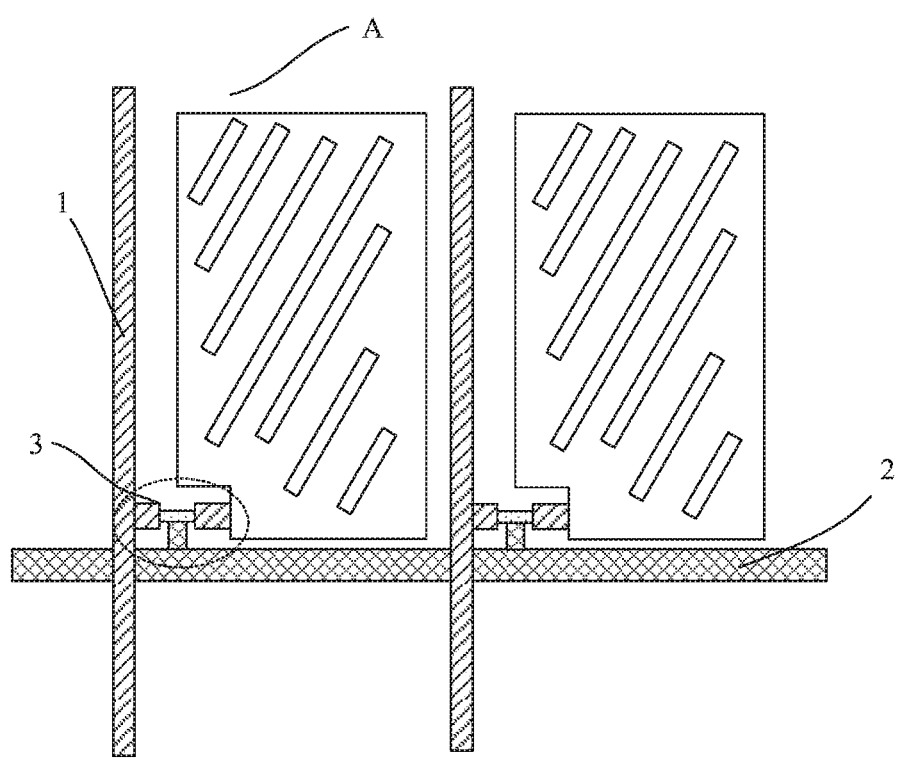
FIG. 1 shows a structural diagram of a display substrate.

FIG. 1 shows a structural diagram of a display substrate. As shown in FIG. 1, the display substrate includes a data line 1, a gate line 2 and a thin film transistor 3, the data line 1 and the gate line 2 define a pixel region, and a pixel electrode and a common electrode is provided in the pixel region, one of the pixel electrode and the common electrode may be a plate electrode, and another one of the pixel electrode and the common electrode may be a slit electrode. As an example, the plate electrode may be the pixel electrode, and the slit electrode may be the common electrode. It should be understood that, the plate electrode may also be the common electrode, and in such case, the slit electrode may be the pixel electrode.

Since the data line 1 is generally provided in a layer different from those in which the pixel electrode and the common electrode are provided, electric fields may be generated between the pixel electrode and the data line 1 and between the common electrode and the data line 1. When the display substrate is used in a liquid crystal display panel, the electric fields generated between the pixel electrode and the data line 1 and between the common electrode and the data line 1 may cause that liquid crystal molecules nearby the data line 1 cannot effectively rotate, resulting in a problem of light leakage. With respect to such problem, a black matrix with a relatively wide light blocking line may be provided at a position corresponding to the data line 1 so as to avoid light leakage around the data line 1. However, in such case, the liquid crystal display panel may have a low aperture ratio.

Figure 2:
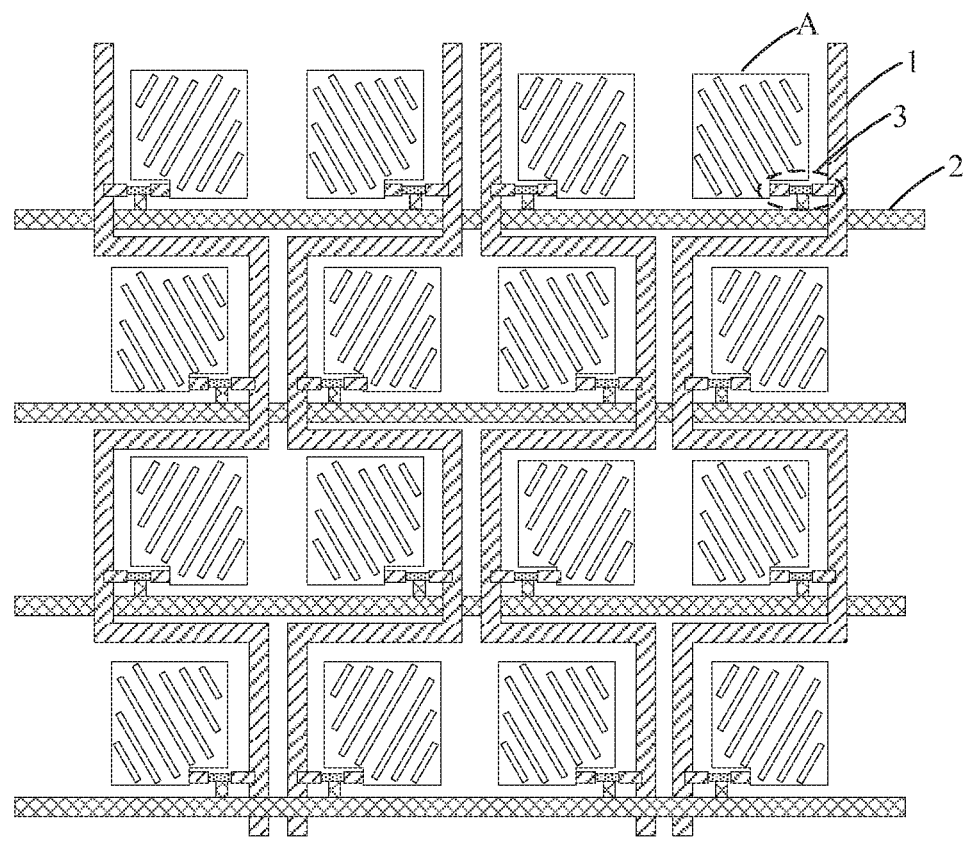
FIG. 2 shows a structural diagram of a display substrate in an embodiment of the present disclosure.

FIG. 2 shows a structural diagram of a display substrate in an embodiment of the present disclosure. As shown in FIG. 2, the display substrate includes a base substrate, data lines 1 and pixels A arranged in an array on the base substrate, each of the data lines 1 extends along a column direction, the pixels A in a single column are connected to one single data line 1 of the data lines 1, any two data lines 1 of the data lines 1 connected to adjacent columns of the pixels A constitute a pair of data lines, any two adjacent pixels A in each row of the pixels A constitute a pair of pixels, each pair of data lines pass through one row of any two adjacent rows of the pixels A by extending between two pairs of pixels, and pass through another one row of the two adjacent rows of the pixels A by extending between two pixels A of one pair of pixels.

In the display substrate of the embodiment, the data lines 1 are provided pair by pair, there is no data line 1 or one pair of data lines 1 provided between any adjacent two pixels A in each row of pixels A. Thus, when the display substrate is used in the liquid crystal display panel, the liquid crystal molecules nearby the position between the adjacent pixels A, at which no data line 1 is provided, may not rotate ineffectively, there is no need to provide the black matrix corresponding to the region between the adjacent pixels A in which no data line 1 is provided, therefore the region between the adjacent pixels A in which no data line 1 is provided is a light transmission region.

It should be noted that, assuming that the electric fields generated between each data line 1 and the pixel electrode and the common electrode may cause that the liquid crystal molecules in a region about 10 μm wide on each of both sides of the data line 1 cannot rotate effectively, in such case, the black matrix needs to be provided, with a width the same as that of the range in which the liquid crystal molecules cannot rotate effectively, at the position corresponding to the data line 1. That is to say, in the display substrate of the embodiment, since the data lines 1 are provided pair by pair, and there is no data line 1 or one pair of data lines 1 provided between any adjacent two pixels A in each row of pixels A, in a row direction, the minimal total width of light blocking lines of the black matrix on both sides of each pixel A equals to a sum of a total width of two data lines 1, 20 μm and a width of a gap between the data lines 1 of one pair of data lines 1. By contrast, in a case where the data lines 1 are provided as shown in FIG. 1, the minimal total width of light blocking lines of the black matrix on both sides of each pixel A equals to a sum of a total width of two data lines 1 and 40 μm. It should be understood that, the width of the gap between the data lines 1 of one pair of data lines 1 is much less than 20 μm. Therefore, the arrangement of the data lines 1 in the display substrate of the embodiment of the present disclosure can effectively improve the aperture ratio of the display substrate.

The display substrate of the embodiment may further include gate lines 2, the gate lines 2 intersect with the data lines 1 to define pixel regions, the pixel A is provided in the pixel region, and each pixel region may be provided with a thin film transistor 3, a pixel electrode and a common electrode. A gate of the thin film transistor 3 may be connected to the gate line 2, a source of the thin film transistor 3 may be connected to the data line 1, and a drain of the thin film transistor 3 may be connected to the pixel electrode.

In some implementations, in a case where the pixel electrode is provided further away from the base substrate than the common electrode, the pixel electrode may be a slit electrode, and the common electrode may be a plate electrode, and in a case where the common electrode is provided further away from the base substrate than the pixel electrode, the common electrode may be the slit electrode, and the pixel electrode may be the plate electrode. Certainly, the present disclosure is not limited thereto.

Figure 3:
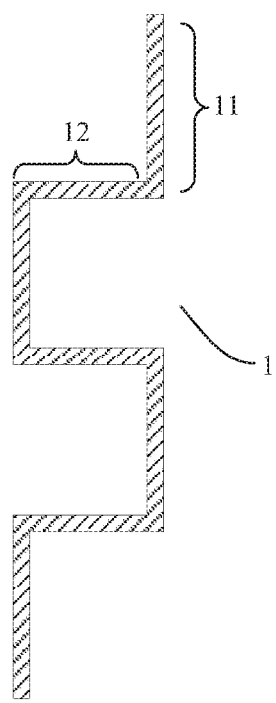
FIG. 3 shows a diagram of a data line in the display substrate in accordance with the embodiment of the present disclosure.

In some implementations, as shown in FIG. 3, each data line 1 may include a plurality of segments 11 and a connection part 12 for connecting any adjacent two segments 11 together, the connection part 12 is provided between adjacent rows of pixels A and in parallel to the gate line 2.

In some implementations, each segment 11 of the data line 1 is provided corresponding to one pixel A in one column of pixels A. In such case, when the display substrate of the embodiment is used in the liquid crystal display panel, a uniform light transmission and a uniform display of the liquid crystal display panel may be achieved. Certainly, each segment 11 of the data line 1 may also be provided corresponding to several pixels A in one column of pixels A, and the specific arrangement may be determined in conjunction with the size of the display substrate, the present disclosure is not limited thereto.

Figure 4:
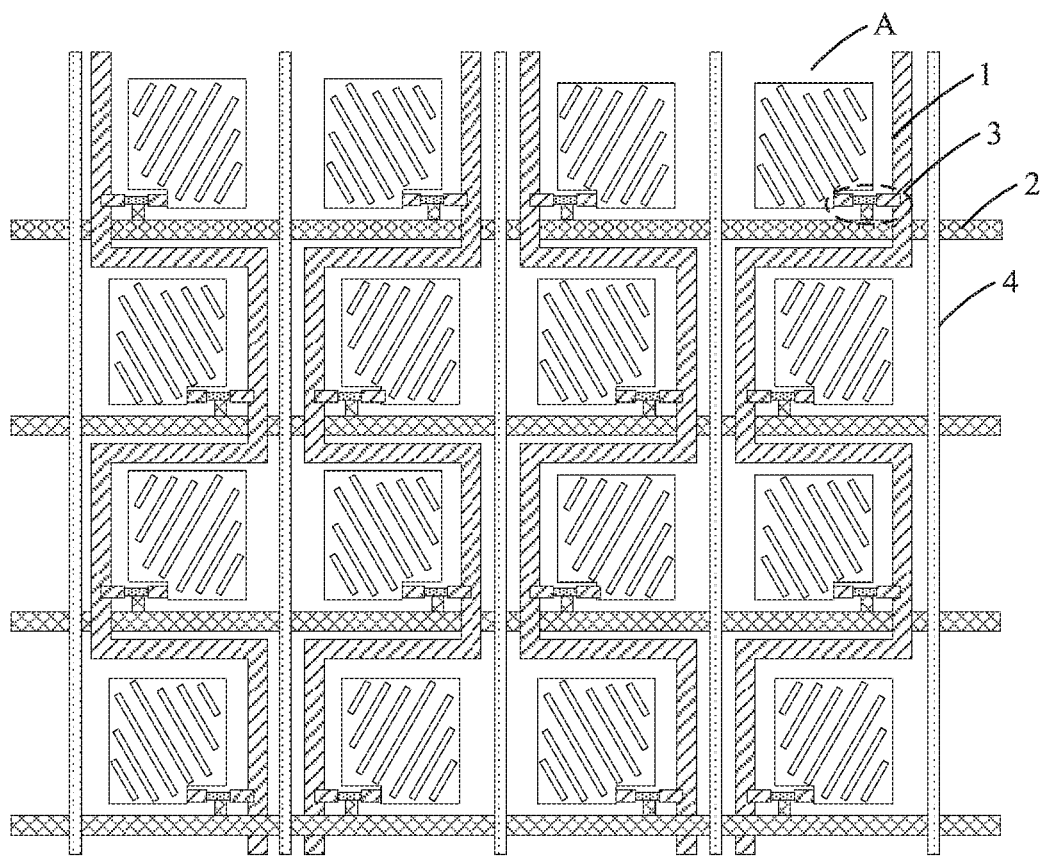
FIG. 4 shows another structural diagram of a display substrate in an embodiment of the present disclosure.

FIG. 4 shows another structural diagram of a display substrate in an embodiment of the present disclosure. As shown in FIG. 4, the display substrate is a touch display substrate, including a base substrate, data lines 1, touch lines 4 and pixels A arranged in an array on the base substrate, each data line 1 extends along a column direction, the pixels A in a single column are connected to one single data line 1 of the data lines 1, any two data lines 1 of the data lines 1 connected to adjacent columns of the pixels A constitute a pair of data lines, any two adjacent pixels A in each row of the pixels A constitute a pair of pixels, each pair of data lines pass through one row of any two adjacent rows of the pixels A by extending between two pairs of pixels, and pass through another one row of the two adjacent rows of the pixels A by extending between two pixels A of one pair of pixels. Each touch line 4 is provided between any two adjacent columns of pixels A.

In some implementations, the touch lines 4 are time-multiplexed as common electrode lines. That is to say, when the display substrate of the embodiment is used in a touch liquid crystal display panel, during a display stage of the touch liquid crystal display panel, the touch lines 4 are used as common electrode lines for achieving a display function, and during a touch stage of the touch liquid crystal display panel, the touch lines 4 are used for achieving a touch function.

In the display substrate of the embodiment, the data lines 1 are provided pair by pair, there is no data line 1 or one pair of data lines 1 provided between any adjacent two pixels A in each row of pixels A, and only the touch line 4 is provided in the region between the adjacent two pixels A in which no data line 1 is provided. Thus, when the display substrate is used in the touch liquid crystal display panel, the liquid crystal molecules nearby the position between the adjacent pixels A, at which no data line 1 and only the touch line 4 is provided, may rotate ineffectively, however, it should be understood that, the touch line 4 has less impact on rotation of the liquid crystal molecules than the data line 1, for example, the electric fields generated between each data line 1 and the common electrode and the pixel electrode may cause that the liquid crystal molecules in the region about 10 μm wide on each of both sides of the data line 1 cannot rotate as desired, the electric fields generated between the touch line 4 and the common electrode and the pixel electrode may cause the liquid crystal molecules in the region about 2 μm wide on each of both sides of the touch line 4 to rotate ineffectively, in such case, in the display substrate of the embodiment, in the row direction, the minimal total width of light blocking lines of the black matrix on both sides of each pixel A equals to a sum of a total width of two data lines 1, 20 μm, a width of a gap between the data lines 1 of one pair of data lines 1, a total width of two touch lines 4 and 8 μm. By contrast, in a case where the data lines 1 are provided as shown in FIG. 1 and the touch line 4 is provided between any adjacent two columns of pixels A, that is, each of both sides of each pixel. A is provided with one data line 1 and one touch line 4, the minimal total width of light blocking lines of the black matrix on both sides of each pixel A equals to a sum of a total width of two data lines 1, 40 μm, a total width of two touch lines 4 and 8 μm. It should be understood that, the width of the gap between the data lines 1 of one pair of data lines 1 is much less than 20 μm. Therefore, the arrangement of the data lines 1 in the display substrate of the embodiment of the present disclosure can effectively improve the aperture ratio of the display substrate.

The display substrate of the embodiment may further include gate lines 2, the gate lines 2 intersect with the data lines 1 to define pixel regions, the pixel A is provided in the pixel region, and each pixel region may be provided with a thin film transistor 3, a pixel electrode, a common electrode. A gate of the thin film transistor 3 may be connected to the gate line 2, a source of the thin film transistor 3 may be connected to the data line 1, and a drain of the thin film transistor 3 may be connected to the pixel electrode.

In some implementations, in a case where the pixel electrode is provided further away from the base substrate than the common electrode, the pixel electrode may be a slit electrode, and the common electrode may be a plate electrode, and in a case where the common electrode is provided further away from the base substrate than the pixel electrode, the common electrode may be the slit electrode, and the pixel electrode may be the plate electrode. Certainly, the present disclosure is not limited thereto.

In some implementations, as shown in FIG. 3, each data line 1 may include a plurality of segments 11 and a connection part 12 for connecting any adjacent two segments 11 together, the connection part 12 is provided between adjacent rows of pixels A and in parallel to the gate line 2.

In some implementations, each segment 11 of the data line 1 is provided corresponding to one pixel A in one column of pixels A. In such case, when the display substrate of the embodiment is used in the liquid crystal display panel, a uniform light transmission and a uniform display of the liquid crystal display panel may be achieved. Certainly, each segment 11 of the data line 1 may also be provided corresponding to several pixels A in one column of pixels A, and the specific arrangement may be determined in conjunction with the size of the display substrate, the present disclosure is not limited thereto.

An embodiment of the present disclosure provides a display device including a display panel, and the display panel includes the display substrate in accordance with the embodiment of the present disclosure, thus the display device of the embodiment has a high aperture ratio.

In some implementations, the display substrate may be an array substrate, and the display panel may further include a color filter substrate provided opposite to the array substrate, and a black matrix is provided in a region of the color filter substrate corresponding to the data lines of the array substrate.

The display device of the embodiment may be any product or member with a display function, such as liquid crystal panel, electronic paper, mobile phone, tablet computer, computer, display, notebook computer, digital photo frame, and navigator.

It should be understood that, as required, the "row" and the "column" in the present disclosure may be exchanged with each other.

In addition, it should be understood that, the above embodiments are merely exemplary embodiments for explaining principle of the present disclosure, but the present disclosure is not limited thereto. Various modifications and improvements may be made by those ordinary skilled in the art without deviating from the scope of the present disclosure, these modifications and improvements fall into the protection scope of the present disclosure.

The invention claimed is:

1. A display substrate, comprising a base substrate, a plurality of data lines and a plurality of pixels arranged in an array on the base substrate, wherein each of the data lines extends along a column direction, the pixels in a single column are connected to one single data line of the data lines, any two data lines of the data lines connected to adjacent columns of the pixels constitute a pair of data lines, any two adjacent pixels in each row of the pixels constitute a pair of pixels, each pair of data lines pass through one row of any two adjacent rows of the pixels by extending between two pairs of pixels, and pass through another one row of the two adjacent rows of the pixels by extending between two pixels of one pair of pixels, wherein no pixel is provided between a portion of two data lines of each pair of data lines, and either no data line or a portion of one pair of data lines are provided between any adjacent two pixels in each row of pixels.

2. The display substrate of claim 1, further comprising a common electrode line provided between any two adjacent columns of pixels.

3. The display substrate of claim 1, wherein in a case where the display substrate is used for a touch function, the common electrode line is multiplexed as a touch line.

4. The display substrate of claim 1, wherein each data line comprises a plurality of segments and a connection part for connecting any two adjacent segments together, and each segment is provided in correspondence with one pixel in one column of pixels.

5. The display substrate of claim 4, further comprising a gate line provided between any two adjacent rows of pixels, and the connection part is provided in parallel to the gate line.

6. The display substrate of claim 1, wherein each pixel comprises a plate electrode and a slit electrode successively provided in a direction away from the base substrate.

7. The display substrate of claim 6, wherein one of the plate electrode and the slit electrode is a pixel electrode, and another one of the plate electrode and the slit electrode is a common electrode.

8. A display device, comprising a display panel, wherein the display panel comprises the display substrate of claim 1.

9. The display substrate of claim 8, wherein the display substrate is an array substrate, and the display panel further comprises a color filter substrate provided opposite to the array substrate, and a black matrix is provided in a region of the color filter substrate corresponding to the data lines of the array substrate.

\* \* \* \* \*